(12) United States Patent
Franz et al.

(10) Patent No.: US 7,719,836 B2
(45) Date of Patent: *May 18, 2010

(54) COOLING FAN MODULE

(75) Inventors: John P. Franz, Houston, TX (US); Troy A. Della Fiora, Houston, TX (US); Joseph R. Allen, Houston, TX (US); Wade D. Vinson, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/472,764

(22) Filed: May 27, 2009

(65) Prior Publication Data
US 2009/0231804 A1 Sep. 17, 2009

Related U.S. Application Data

(63) Continuation of application No. 11/462,502, filed on Aug. 4, 2006, now Pat. No. 7,558,061.

(51) Int. Cl.
*H05K 7/20* (2006.01)

(52) U.S. Cl. .................. 361/695; 361/694; 361/715; 415/213.1; 454/184

(58) Field of Classification Search ............ 361/695
See application file for complete search history.

(56) References Cited

U.S. PATENT DOCUMENTS

| | | | |
|---|---|---|---|
| 4,807,718 A | 2/1989 | Lotz | |
| 4,931,904 A | 6/1990 | Yiu | |
| 5,562,410 A | 10/1996 | Sachs et al. | |
| 5,788,467 A * | 8/1998 | Zenitani et al. | 417/360 |
| 5,927,944 A | 7/1999 | Belady | |
| 6,071,082 A * | 6/2000 | Lecinski et al. | 417/53 |
| 6,162,663 A | 12/2000 | Schoenstein et al. | |
| 6,219,242 B1 | 4/2001 | Martinez | |
| 6,457,949 B1 * | 10/2002 | Bendikas et al. | 417/360 |
| 6,508,621 B1 | 1/2003 | Zeighami et al. | |
| 6,517,315 B2 | 2/2003 | Belady | |
| 6,538,887 B2 | 3/2003 | Belady et al. | |
| 6,692,226 B1 | 2/2004 | Cheng | |
| 6,776,578 B2 | 8/2004 | Belady | |
| 6,972,956 B2 | 12/2005 | Franz et al. | |
| 6,985,358 B2 | 1/2006 | Thompson et al. | |
| 7,056,204 B2 | 6/2006 | Vinson et al. | |
| 7,111,994 B2 | 9/2006 | Schwiebert et al. | |
| 7,558,061 B2 * | 7/2009 | Franz et al. | 361/695 |
| 2002/0015648 A1 | 2/2002 | Kosugi | |
| 2002/0048520 A1 | 4/2002 | Lu et al. | |
| 2003/0019646 A1 | 1/2003 | Clements et al. | |
| 2003/0123222 A1 | 7/2003 | Thompson et al. | |
| 2003/0174467 A1 * | 9/2003 | Lu | 361/695 |

(Continued)

OTHER PUBLICATIONS

Franz, J. P., Office Action dated Nov. 19, 2008, U.S. Appl. No. 11/462,502, filed Aug. 4, 2006, 17 p.

*Primary Examiner*—Gregory D Thompson (57) ABSTRACT

A cooling fan module is disclosed. The cooling fan module includes a module housing, a fan assembly, a fan control circuit board, and an electrical connector. The fan assembly is disposed within the module housing and includes a fan housing, a motor disposed within the fan housing, and a blade assembly coupled to the motor. The fan control circuit board is disposed between the module housing and the fan housing, and is coupled to the motor. The electrical connector is coupled to the fan control circuit board and projects outside of the module housing.

20 Claims, 6 Drawing Sheets

U.S. PATENT DOCUMENTS

| | | |
|---|---|---|
| 2003/0227748 A1 * | 12/2003 | Chen et al. .................. 361/695 |
| 2004/0256334 A1 | 12/2004 | Chen |
| 2005/0184605 A1 | 8/2005 | Vinson et al. |
| 2005/0233688 A1 | 10/2005 | Franz |
| 2005/0254210 A1 | 11/2005 | Grady et al. |
| 2006/0012955 A1 | 1/2006 | Vinson et al. |
| 2006/0016482 A1 | 1/2006 | Berens et al. |
| 2007/0139882 A1 | 6/2007 | Bartell et al. |

* cited by examiner

FIG.8 ns. Generally, any electrical device through which electrical current flows produces heat. The amount of heat any one device generates generally is a function of the amount of current flowing through the device.
COOLING FAN MODULE

CROSS-REFERENCE TO RELATED APPLICATIONS

This application is a continuation of U.S. patent application Ser. No. 11/462,502, filed on Aug. 4, 2006 now U.S. Pat. No. 7,558,061 and entitled "Cooling Fan Module," which is hereby incorporated herein by reference in its entirety for all purposes.

BACKGROUND

Computer systems include numerous electrical components that draw electrical current to perform their intended functions. For example, a computer's microprocessor or central processing unit ("CPU") requires electrical current to perform many functions such as controlling the overall operations of the computer system and performing various numerical calculations. Generally, any electrical device through which electrical current flows produces heat. The amount of heat any one device generates generally is a function of the amount of current flowing through the device.

Typically, an electrical device is designed to operate correctly within a predetermined temperature range. If the temperature exceeds the predetermined range (i.e., the device becomes too hot or too cold), the device may not function correctly, thereby potentially degrading the overall performance of the computer system. Thus, many computer systems include cooling systems to regulate the temperature of their electrical components. One type of cooling system is a forced air system that relies on one or more cooling fans to blow air over the electronic components in order to cool the components.

The cubic feet per minute ("CFM") of air that can be moved across an electric device is an important factor in how much heat can be removed from the device. Thus, the capacity of a cooling fan is a critical factor in selecting an air mover for use in a cooling application. The CFM that a cooling fan can produce is governed a number of factors including: the total area of the blades generating the airflow, the free area provided for airflow through the fan, the design of the blades, and the power generated by the electric motor.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
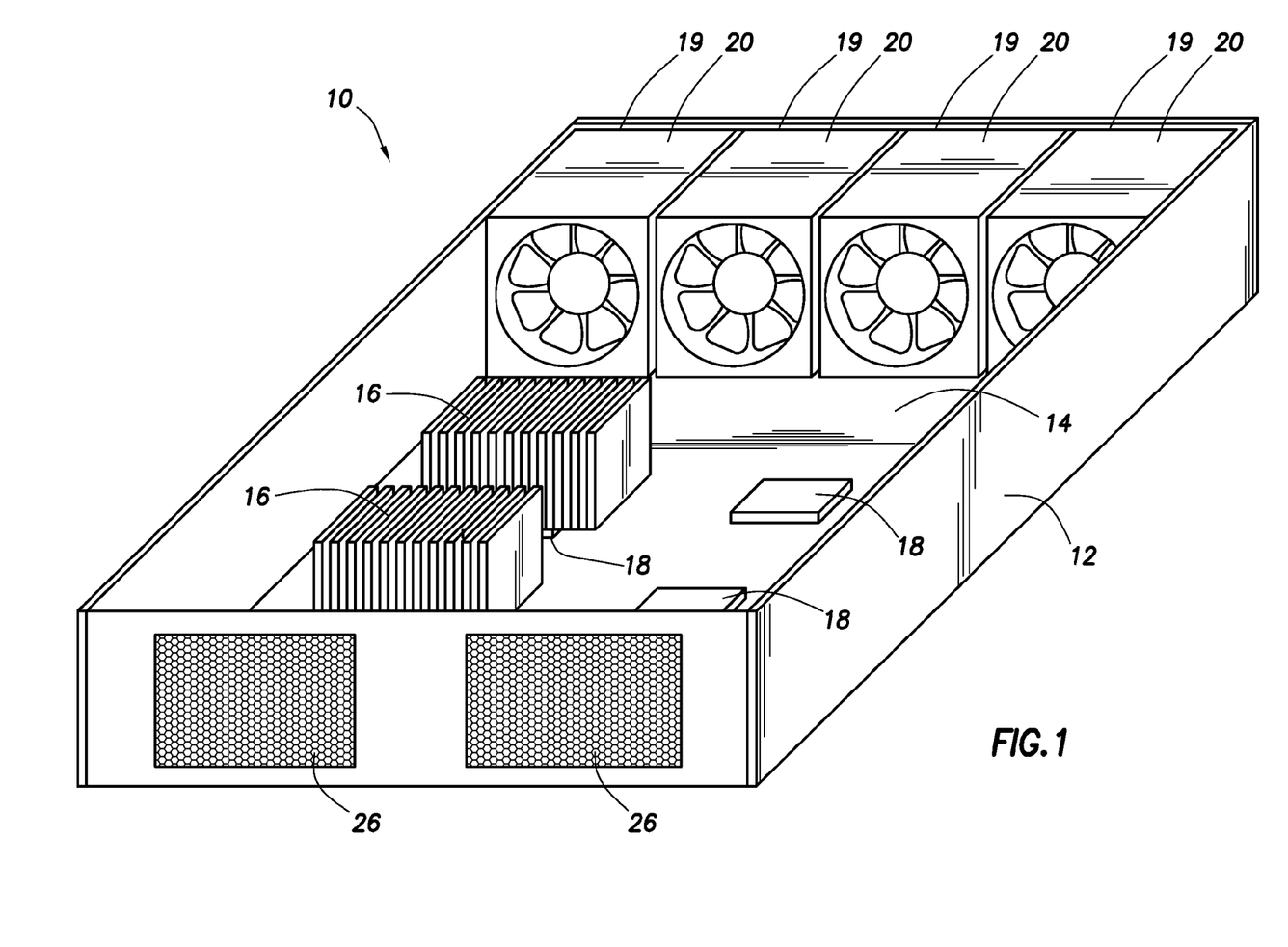
FIG. 1 shows a computer system comprising cooling fan modules constructed in accordance with embodiments of the invention.
Figure 2:
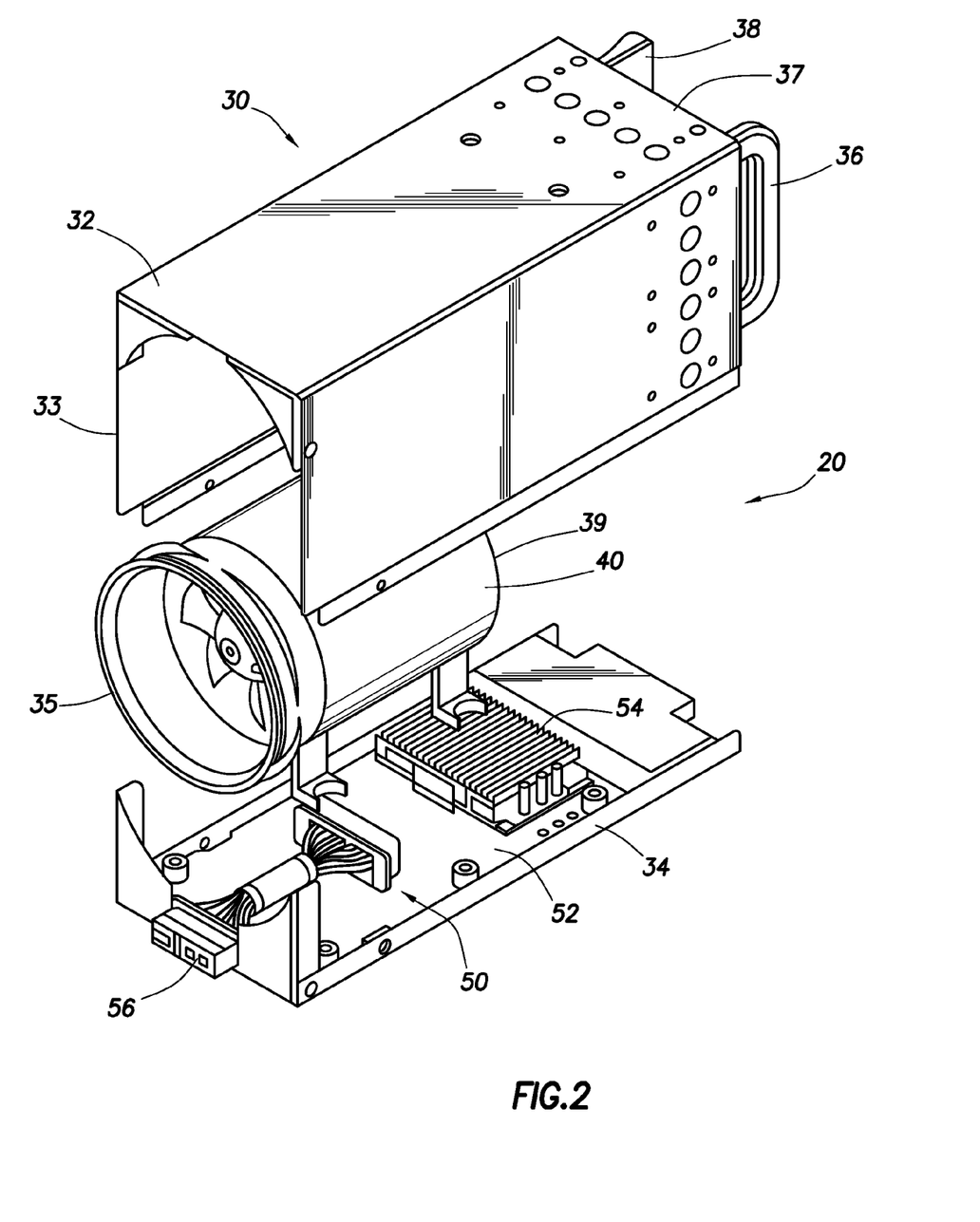
FIG. 2 shows a partially exploded view of one embodiment of a cooling fan module.

Referring now to FIG. 1, a computer assembly 10 comprises chassis 12, motherboard 14, heat sinks 16, electronic components 18, and receptacles 19 containing cooling fan modules 20. As shown in FIG. 2, each cooling fan module 20 comprises a module housing 30 surrounding a fan assembly 40. Referring back to FIG. 1, cooling fan modules 20 are arranged so as to generate an airflow that enters chassis 12 through inlets 26 and passed in thermal communication with electronic components 18. Heat sinks 16 may be arranged so as to be directly in the airflow generated by fan modules 20. Heat sinks 16 are coupled to electronic components so that the heat generated by the electronic component is dissipated to the airflow through the increased surface area of the heat sink.

FIG. 2 is a partially exploded view of cooling fan module 20. Cooling fan module 20 comprises module housing 30, fan assembly 40, and electronics assembly 50. Module housing 30 comprises upper housing 32, lower housing 34, handle 36, and latch mechanism 38. Fan assembly 40, as shown partially exploded in FIG. 3, comprises fan housing 42, motor 44, blade assembly 46, and end cap 48. Electronics assembly 50 comprises motor control circuit board 52, heat sink 54, and connector 56.

Cooling fan module 20 allows for live, "hot-pluggable" removal and insertion of a cooling fan along with co-location of the fan electronics. Cooling fan module 20 may also provide back flow prevention and reduction of acoustic radiation, vibrations, and electromagnetic emissions. Cooling fan modules 20 can be used as individual air movers or may be used in a system utilizing a plurality of modules.

Fan assembly 40 is assembled with module housing 30 such front 33 of the module housing is substantially co-planar with inlet 35 into fan assembly 40. Outlet 39 of fan assembly 40 is recessed within module housing 30, offset from module housing outlet 37. Module housing 30 is also configured so as to provide a volume of space surrounding fan assembly 40. The volume between fan assembly 40 and module housing 30 provides space for the mounting of electronics assembly 50, acoustic insulation and/or attenuation materials, electromagnetic insulators, vibrations reducers, and devices to control airflow through the module.

Electronics assembly 50 is mounted to lower housing 34. Motor control circuit board 52 may comprise electrical circuits and components such as commutation circuitry, position decoders, oscillators, current drivers, and other circuits and components used to direct electrical signals to the windings of motor 44. Because motor control circuit board 52 is not constrained by fan housing 42, a larger circuit board can be used. A larger circuit board allows for the use of larger components on the circuit boards, which are often cheaper. Larger circuit boards also allow electrical circuit designers more space for constructing efficient circuits.

Heat sink 54 is thermally coupled to motor control circuit board 52 so as to enhance cooling of the electrical components on the circuit board. Heat sink 54 may be disposed at least partially within the airflow generated by fan assembly 40 so as to further improve cooling of circuit board 52. In certain embodiments, motor control circuit board 52 may not require heat sink 54 and therefore the heat sink may not be included in cooling fan module 20.

Connector 56 provides an electrical connection between motor control circuit board 52 and the motherboard 14 and electrical components 18 within chassis 12. Connector 56 projects through the outside of module housing 30 so as to automatically engage a corresponding receptacle mounted on chassis 12 as fan module 20 is being inserted into the chassis. Connector 56 may be a cable connector, card connector (see FIG. 7), or any other electrical connector. In certain embodiments, fan module 20 may be hot-pluggable and be able to be removed and installed into computer assembly 10 without interrupting the operation of the computer system.

Figure 3:
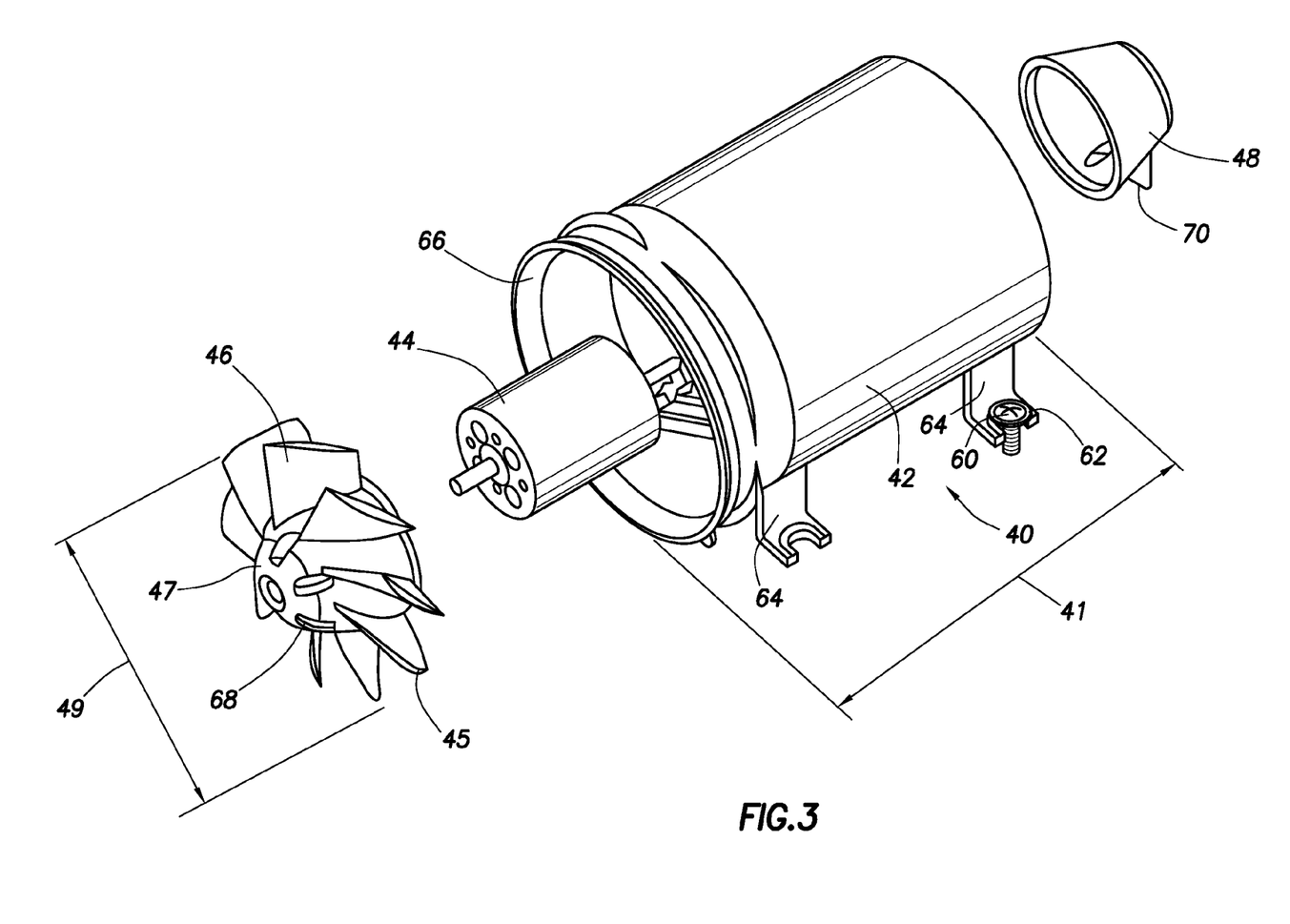
FIG. 3 shows a partially exploded view of one embodiment of a fan assembly.

As shown in FIG. 3, fan assembly 40 is coupled to lower housing 34 by fasteners 60. Vibration isolators 62 are disposed between fasteners 60 and fan housing legs 64. Vibration isolators 62 may be constructed from a resilient material that serves to absorb vibrations generated by fan assembly 40 and reduce the vibrations transferred to chassis 20. Vibration isolators 62 may be rubber, foam, elastomers, polymers, metal springs, or any other vibration absorbing material or mechanism.

Fan housing 42 comprises tapered, or bell-shaped inlet 66 that guides the airflow toward blade assembly 46. Fan housing 42 may have an overall length 41 at least twice the diameter 49 of blade assembly 46. Blade assembly 46 comprises radial blades 45 and hub 47 that include features that improve aerodynamic performance of fan assembly 40. For example, radial blades 45 may have an aerodynamically optimized shape and be closely spaced so as to generate sufficient differential pressure across the blade assembly. Blades 45 have an outer blade diameter 49 that provides a small gap between the blade tips and the inside of fan housing 42. Hub 47 has a conical shape that helps smooth the flow of air into the blades.

Blade assembly 46 also comprises air scoops 68 disposed on hub 47 that allow air to flow directly over motor 44 during operation of the fan. As the flow of air passes over motor 44, heat generated by the windings section or the motor is transferred to the air. This heat transfer decreases the temperature of the windings section and may allow motor 44 to be operated at a higher power. The airflow across motor 44 also helps to reduce the temperature of bearings that are used to support the rotating shaft to which blade assembly 46 is mounted. Reducing the temperature of the bearings may also reduce the degradation of grease used in the bearings and may allow for the use of lower cost bearings and grease.

End cap 48 is disposed on the downstream end of motor 44 and provides a smooth transition as the airflow moves past motor 44. The smooth transition allows for a gradual expansion of the airflow as it moves toward the outlet from fan housing 42. This gradual expansion reduces pressure disturbances in the airflow. End cap 48 also comprises wire guide 70. The electrical wires that couple motor 44 to control circuit board 52 run through wire guide 70 so that the wires do not cause a disruption in the primary air flow through fan assembly 40.

Figure 4:
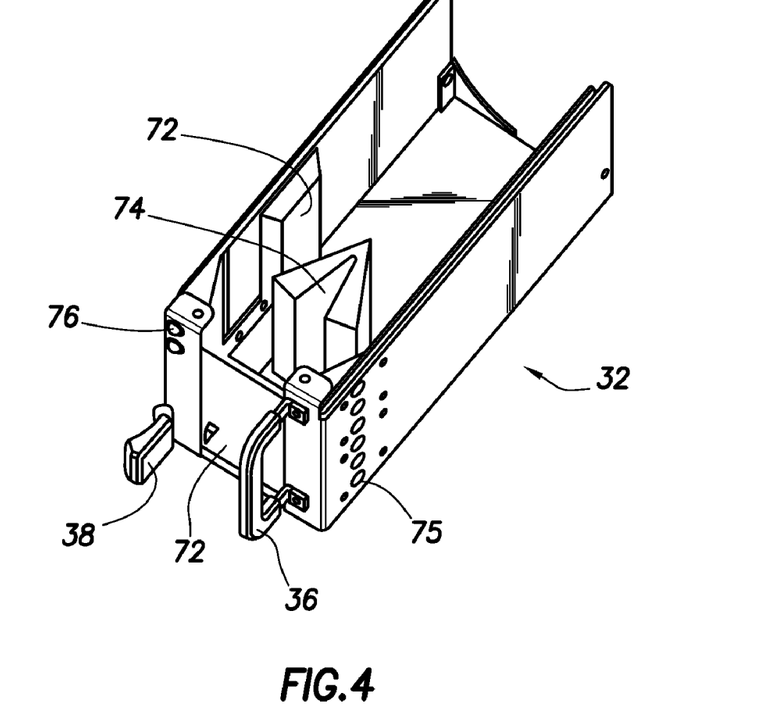
FIG. 4 shows a portion of one embodiment of a fan module housing.

Referring now to FIG. 4, the underside of upper housing 32 is shown. Upper housing 32 may be fully or partially lined with an acoustic material 72 that serves to absorb, attenuate, or reflect acoustic energy in order to reduce acoustic emissions from fan module 20. Acoustic material 72 may be acoustic foam, acoustic baffles, or any other material that absorbs or attenuates acoustic energy. Upper housing 32 may also comprise flow diffuser 74 that also helps reduce acoustic emissions and may be lined with an acoustic material. Upper housing 32 may also comprise electromagnetic interference ("EMI") contacts 75 that provide a conductive contact to chassis 12 and serve to reduce electromagnetic emissions from fan module 20.

Handle 36 provides a gripping surface for use in removing and installing fan module 20 from chassis 12. In certain embodiments, latch mechanism 38 engages with a corresponding receptacle on chassis 12 to retain fan module 20 within the chassis. Upper housing 32 may also comprise visual indicators 76, such as light emitting diodes, to provide a visual indication of the operational status of fan module 20.

Figure 5:
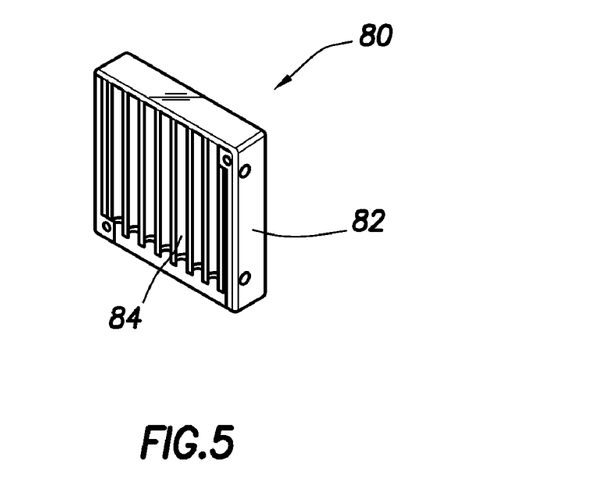
FIG. 5 shows one embodiment of a back flow preventer.

Referring now to FIG. 5, a back flow preventer 80 may be installed on fan module 20 or on chassis 12. Back flow preventer 80 operates to restrict the flow of air when a particular fan module is inoperable or removed from the system. Back flow preventer 80 comprises frame 82 and louvers 84. Louvers 84 are biased to a closed position but open automatically to allow airflow to pass therethrough. Thus, back flow preventer 80 has a first position that allows the passage of air when fan module 20 is in operation and a second position that prevents the passage of air when the fan module is not in operation. Back flow preventer 80 may comprise other selectively opening mechanisms, such as valves or other flow control devices, to prevent back flow when the fan is not operating.

Figure 6:
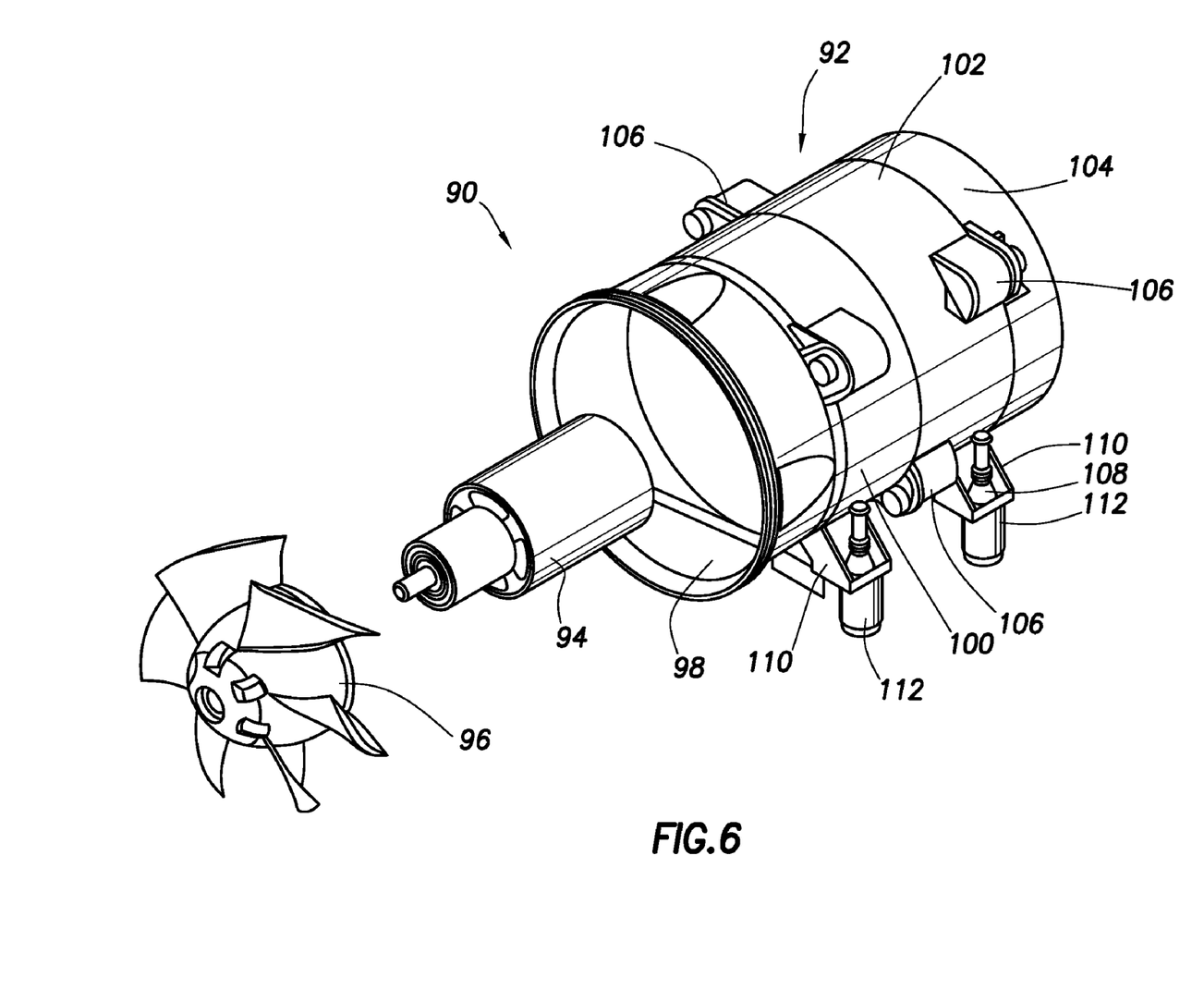
FIG. 6 shows a partially exploded view of one embodiment of a fan assembly.

FIG. 6 illustrates a fan assembly 90 comprising a fan housing 92, motor 94, and blade assembly 96. Fan housing 92 is a multi-piece housing comprising inlet ring 98, blade housing 100, motor housing 102, and outlet ring 104. It is understood that a multi-piece housing may be constructed from any number of components or pieces as may be desirable. Separate pieces of the housing may be used so as to ease construction and assembly or to provide advantageous thermal or aerodynamic properties. The pieces of fan housing 92 are interconnected by fasteners 106 and may also be joined by other methods including adhesives, welding, and brazing. Fan housing 92 couples to a lower housing via fasteners 108 engaged with legs 110. Vibration isolators 112 are disposed between fan housing legs 110 and the lower housing.

When motor 94 and blade assembly 96 are installed into housing 92, motor 94 is supported within motor housing 102 and blade assembly 96 is disposed within blade housing 100. Blade housing 100 and blade assembly 96 may be constructed so as to minimize the clearance between the outer tips of the blades and the inner surface of the housing. Minimizing this tip clearance distance allows the maximum possible blade diameter to be used, which increases fan performance. Each of inlet ring 98, blade housing 100, motor housing 102, and outlet ring 104 may be constructed of metal or plastic materials as may be desired. For example, blade housing 100 may be a machined metal component so as to closely control the inside diameter while inlet ring 98 may be constructed from a molded plastic material so as to minimize its cost and weight.

Figure 7:
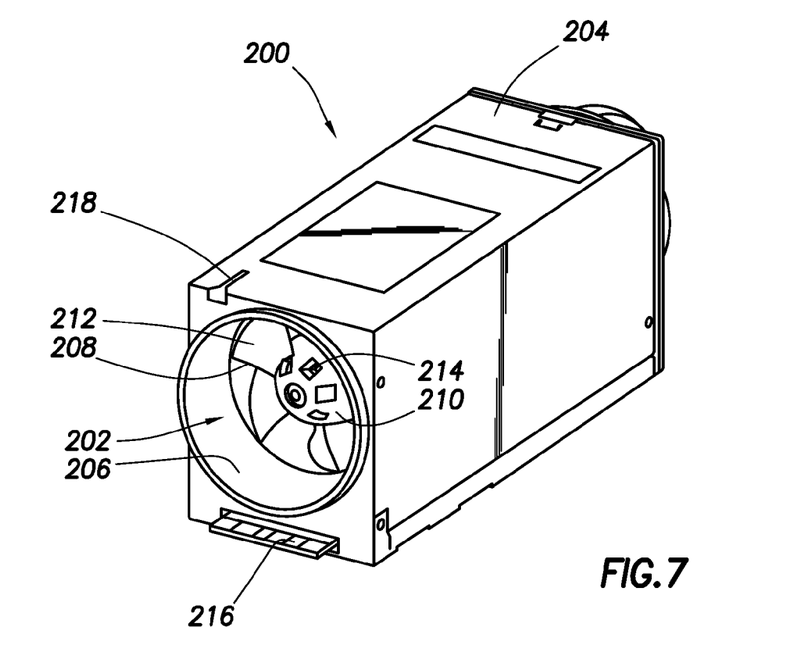
FIG. 7 shows an isometric front view of one embodiment of a cooling fan module constructed in accordance with embodiments of the invention.
Figure 8:
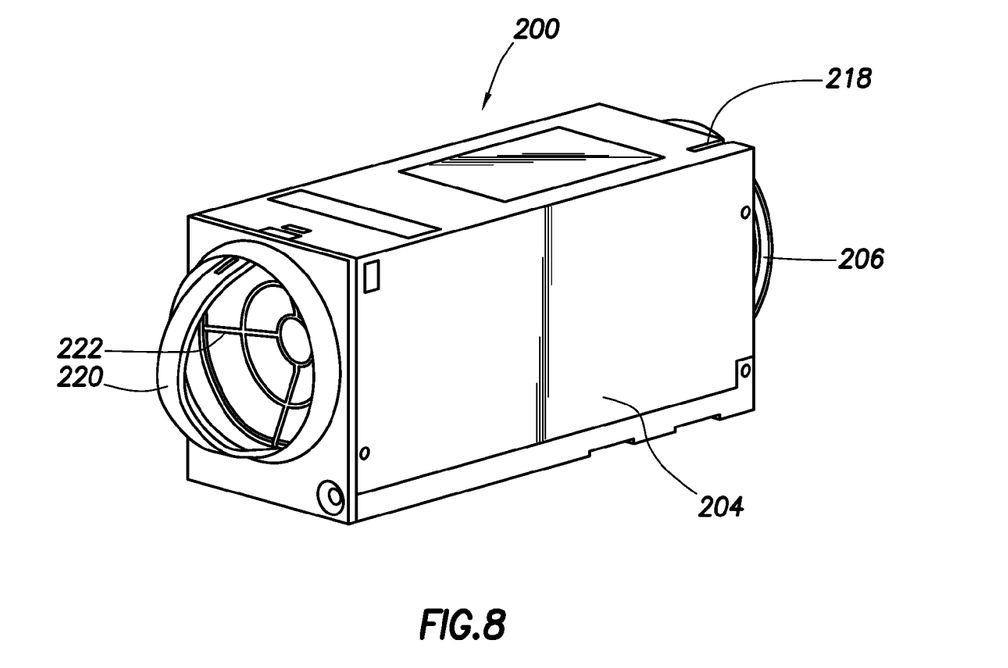
FIG. 8 shows an isometric rear view of the cooling fan module of FIG. 7.

FIGS. 7 and 8 show cooling fan module 200 comprising fan assembly 202 disposed within module housing 204. Fan assembly 202 comprises tapered inlet 206 that guides airflow toward blade assembly 208, which comprises hub 210 and radial blades 212. Hub 210 comprises air scoops 214 that guide air across the electric motor powering blades 212. Card connector 216 extends from module housing 204 and engages a corresponding receptacle mounted on a chassis (not shown) when cooling fan module 200 is installed into the chassis. Alignment slot 218 interfaces with the chassis so as to ensure that cooling fan module 200 properly engages the chassis. Removal handle 220 is integrated into outlet grill 222 on module housing 204. Removal handle 220 is coupled to a release mechanism that allows fan module 200 to be released and removed from a chassis by rotating the handle about outlet grill 222.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A cooling fan module comprising:
  a module housing having an inner surface;
  a fan assembly disposed within the module housing, the fan assembly comprising:
    a blade assembly having a longitudinal centerline parallel to the inner surface;
    a fan housing having an outer surface extending parallel to the centerline; and
    a motor disposed within the fan housing and coupled to the blade assembly;
  a fan control circuit board coupled to the motor, the fan control circuit board disposed between the inner surface of the module housing and the outer surface of the fan housing and extending parallel to the inner surface; and
  an electrical connector coupled to the fan control circuit board and projecting outside of the module housing.

2. The cooling fan module of claim 1, further comprising a vibration isolator coupled between the fan assembly and the module housing.

3. The cooling fan module of claim 1, further comprising an acoustic material disposed within the module housing.

4. The cooling fan module of claim 1, further comprising EMI contacts disposed on the module housing.

5. The cooling fan module of claim 1, wherein the fan housing comprises a plurality of sub-housings.

6. The cooling fan module of claim 1, wherein the blade assembly comprises:
  a plurality of blades extending radially from a conical hub; and
  a plurality of air scoops disposed through the conical hub.

7. The cooling fan module of claim 1, further comprising a handle connected to the module housing.

8. The cooling fan module of claim 1, further comprising a latch mechanism connected to the module housing.

9. The cooling fan module of claim 1, wherein the module housing comprises one or more visual indicators to provide a visual indication of the operational status of the cooling fan module.

10. The cooling fan module of claim 9, wherein at least one of the visual indicators is a light emitting diode.

11. The cooling fan module of claim 1, wherein the fan housing comprises a tapered inlet.

12. The cooling fan module of claim 1, wherein the fan assembly comprises a tapered end cap.

13. A computer assembly comprising:
  a chassis supporting a motherboard with an electronic component coupled thereto;
  a cooling fan module disposed within the chassis, wherein the cooling fan module comprises a module housing having an inner surface;
  a fan assembly disposed within the module housing, wherein the fan assembly comprises:
    a blade assembly having a longitudinal centerline parallel to the inner surface;
    a fan housing having an outer surface extending parallel to the centerline; and
    a motor disposed within the fan housing;
  a fan control circuit board coupled to the motor, the fan control circuit board disposed between the inner surface of the module housing and the outer surface of the fan housing and extending parallel to the inner surface; and
  an electrical connector coupled to the fan control circuit board and the motherboard, wherein the electrical connector projects outside of the module housing.

14. The computer assembly of claim 13, wherein the fan housing comprises a bell-shaped inlet.

15. The computer assembly of claim 13, wherein the module housing comprises a light emitting diode configured to visually indicate the operational status of the computer assembly.

16. A fan module comprising:
  a module housing having an inner surface;
  a fan assembly disposed with the module housing, the fan assembly comprising:
    a blade assembly having a longitudinal centerline parallel to the inner surface;
    a fan housing having an outer surface extending parallel to the centerline; and
    a motor disposed within the fan housing and coupled to the blade assembly;
  a fan control circuit board coupled to the fan assembly, the fan control circuit board disposed between the inner surface of the module housing and the outer surface of the fan housing and extending parallel to the inner surface;
  an electrical connector coupled to the fan control circuit board and projecting outside of the module housing;
  a vibration isolator coupled between the fan assembly and the module housing; and
  an acoustic material disposed within the module housing.

17. The fan module of claim 16, wherein the fan assembly comprises:
  a fan housing having an overall length;
  a motor disposed within the fan housing; and
  a blade assembly disposed within the housing and rotatably coupled to the motor, wherein the overall length of the fan housing is at least twice a diameter of the blade assembly.

18. The fan module of claim 17, wherein the blade assembly comprises:
  a plurality of blades extending radially from a conical hub; and
  a plurality of air scoops disposed through the conical hub.

19. The fan module of claim 16, further comprising EMI contacts disposed on the module housing.

20. The fan module of claim 16, wherein the module housing comprises a straight or diverging flow diffuser.

* * * * *